US010148267B2

United States Patent
Reinhart et al.

(10) Patent No.: US 10,148,267 B2
(45) Date of Patent: Dec. 4, 2018

(54) OPERATING UNIT FOR A COFFEE MACHINE

(71) Applicant: Eugster/Frismag AG, Amriswil (CH)

(72) Inventors: Stefan Reinhart, Schocherswil (CH); Simon Wager, Amriswil (CH); Wolfgang Riessbeck, Landschlacht (CH)

(73) Assignee: Eugster/Frismag AG, Amriswil (CH)

( * ) Notice: Subject to any disclaimer, the term of this patent is extended or adjusted under 35 U.S.C. 154(b) by 80 days.

(21) Appl. No.: 14/768,856

(22) PCT Filed: Feb. 6, 2014

(86) PCT No.: PCT/EP2014/052352
§ 371 (c)(1),
(2) Date: Aug. 19, 2015

(87) PCT Pub. No.: WO2014/128005
PCT Pub. Date: Aug. 28, 2014

(65) Prior Publication Data
US 2016/0006435 A1    Jan. 7, 2016

(30) Foreign Application Priority Data
Feb. 20, 2013   (DE) .................. 20 2013 100 760 U

(51) Int. Cl.
*A47J 31/46*   (2006.01)
*H03K 17/96*   (2006.01)
*H05K 1/02*    (2006.01)

(52) U.S. Cl.
CPC .......... *H03K 17/962* (2013.01); *A47J 31/465* (2013.01); *H03K 17/9622* (2013.01);
(Continued)

(58) Field of Classification Search
CPC ............ H03K 17/9622; H03K 17/962; H03K 2017/9602; H03K 2217/94094;
(Continued)

(56) References Cited

U.S. PATENT DOCUMENTS

2006/0238513 A1* 10/2006 Philipp .............. H03K 17/9622
345/173
2008/0105455 A1* 5/2008 Palfreyman .......... H05K 1/0271
174/254

(Continued)

FOREIGN PATENT DOCUMENTS

DE  10 2006 013 937   9/2007
DE  10 2007 035 455   2/2009
(Continued)

OTHER PUBLICATIONS

International search report dated May 15, 2014.

*Primary Examiner* — Thien S Tran
(74) *Attorney, Agent, or Firm* — Bachman & LaPointe, PC

(57) ABSTRACT

A fully automatic coffee machine (1) includes an operating unit (2) having at least one touch sensor (102) for generating an operating signal, and a signal-conductor (20) to conduct the operating signal to a logic unit (202) connected to a coffee-producing assembly. The touch sensor (102), signal-conductor (20) and logic unit (202) are arranged on a common printed circuit board (10). The logic unit (202) is arranged in a logic section (200) of the printed circuit board (10) and the touch sensor (102) is arranged in a sensor section (100) on the printed circuit board (10). The logic section (200) integrally transitions into the sensor section (100), and is embodied as a logic unit flap which is released from the sensor section (100), such that and is delimited from the sensor section (100) by at least one recess (204) in
(Continued)

the printed circuit board such that the logic section (200) is not deformed by deformation of the sensor section (100).

14 Claims, 5 Drawing Sheets

(52) U.S. Cl.
CPC ... *H05K 1/0278* (2013.01); *H03K 2017/9602* (2013.01); *H03K 2217/94094* (2013.01); *H03K 2217/960755* (2013.01); *H05K 2201/09081* (2013.01); *H05K 2201/10151* (2013.01); *H05K 2203/302* (2013.01)

(58) Field of Classification Search
CPC ..... H03K 2217/960755; H05K 1/0278; H05K 2201/09081; H05K 2201/10151; H05K 2203/302
USPC ....... 99/280, 281, 297, 300, 323.1; 345/173, 345/174, 177, 661
See application file for complete search history.

(56) References Cited

U.S. PATENT DOCUMENTS

| | | | |
|---|---|---|---|
| 2008/0143559 A1* | 6/2008 | Dietz | G06F 3/016 341/20 |
| 2012/0249467 A1* | 10/2012 | Kotala | A47L 15/4293 345/174 |

FOREIGN PATENT DOCUMENTS

| | | |
|---|---|---|
| DE | 10 2009 007 911 | 8/2010 |
| DE | 10 2010 032 951 | 2/2012 |
| DE | 10 2011 078 985 | 3/2012 |
| DE | 10 2011 077 902 | 12/2012 |
| EP | 1 924 000 | 5/2008 |
| EP | 2 337 225 | 6/2011 |

* cited by examiner

OPERATING UNIT FOR A COFFEE MACHINE

BACKGROUND OF THE INVENTION

The instant invention relates to a coffee machine as well as to a coffee machine mounting method.

It is known from the prior art to control coffee machines by means of touch-sensitive operating elements comprising touch sensors. In particular, conductive surfaces are used thereby, by means of which a touch can be detected as capacitive elements.

The coffee machine can be controlled by means of such operating elements via logic means, in particular in the form of microcontrollers or the like, in particular in that further elements, such as in particular water heating means, a grinder and/or a brewing unit are controlled. For example, the type of the desired beverage and/or the roasting degree can be selected by means of the operating elements. On the basis of the changes of the capacitive characteristics of the touch sensors, the logic means detect a touch and react to it in a predetermined manner. Such logic means are common in particular as so-called surface-mounted device (SMD) components.

For creative reasons, an uneven shape is often selected for the outer shape of coffee machines, in particular for the front panels. Due to the fact that the outer contour of the operating elements needs to be adapted to this shape, flexible conductor foils are used, for example PE foils, which are imprinted with silver, or transparent foils, which are coated with indium tin oxide (ITO), to which the operating elements are applied.

However, such conductor foils are not very well suited for an assembly with commercial SMD components, because SMD components are on principle only embodied and intended for an assembly on a flat printed circuit board.

Among others, this is one reason why the logic means and further SMD components, such as sensing resistors, are arranged on additional printed circuit boards, which are arranged in a rear or inner area, respectively, of the coffee machine.

The operating signal of the touch sensors is conducted to the further printed circuit boards via long signal lines, mostly via a plurality of plug-in connections. This creates a plurality of contact locations and interference capacities, which oppose an exact evaluation of the operating signals. The design and mounting effort is also increased due to these additional lines.

An operating panel arrangement for washing machines and laundry driers is known from DE 10 2006 013 937 A1, in the case of which electrodes for calculating an operating finger position and evaluating means are arranged on a continuously curved printed circuit board. A bending of the printed circuit board can lead to hairline cracks in signal-conducting means (conductor paths) here.

A touch-sensitive operating element is known from US 2006/0238513 A1, wherein touch-sensitive sensors are connected via cables to logic means, which are arranged on a printed circuit board, which is located at a distance therefrom.

A similar setup follows from a capacitive touch switch, which is shown in DE 10 2007 035 455 A1.

DE 10 2011 077 902 A1 shows an operating and display device for household appliances comprising sensor electrodes, which are arranged on a straight printed circuit board, wherein a curved operating surface is arranged upstream of the continuously straight printed circuit board.

DE 10 2010 032 951 A1 shows a continuously curved printed circuit board for a capacitive touch sensor, wherein the printed circuit board is connected to a separate printed circuit board comprising evaluating electronics via a flexible connection.

DE 10 2011 078 985 A1 teaches possibilities for touch recognition of three-dimensional objects.

SUMMARY OF THE INVENTION

It is thus the object of the instant invention to specify a coffee machine, which does not have the above-mentioned disadvantages, in particular in the case of which an uneven operating element can be operated with as little interference as possible, wherein the mounting effort is reduced at the same time. It is also the object to specify a mounting method, which provides for a mounting of the coffee machine, without resulting in damages to components in spite of an uneven operating element.

This object is solved by means of a coffee machine comprising the features disclosed herein, namely by means of a coffee machine, in particular a fully automatic coffee machine, comprising an operating unit, which has at least one, preferably a capacitive touch sensor for generating an operating signal when touched by an operator, and signal-conducting means, which are embodied to conduct the operating signal to logic means, which are connected to coffee-producing means in a signal-conducting manner, wherein the touch sensor, the signal-conducting means and the logic means are arranged on a common printed circuit board, wherein the logic means are arranged in a flat logic means section of the printed circuit board and the touch sensor is arranged in a sensor section on a printed circuit board, wherein the sensor section extends out of the plane of the logic means section, in particular in an arched manner, and wherein the logic means section integrally transitions into the sensor section. Touching must hereby not mandatorily be understood as a direct contact between operator and touch sensor; instead, it suffices that, by approaching the touch sensor, the person touching it influences the touch sensor such that it generates an operating signal, in particular by changing the capacitive characteristics.

The arranging according to the invention of the touch sensors as well as of the logic means on a common printed circuit board is made possible in that a logic means section is provided, in which the common printed circuit board is embodied so as to be flat. The logic means (preferably at least one microcontroller), and preferably all surface-mounted components, in particular sensing resistors or series resistors, respectively, which are assigned to the touch sensors, are arranged in this logic means section.

According to the invention, provision is made to provide an uneven touch sensor section as well as a flat logic means section on a common printed circuit board and to nonetheless be able to deform, in particular to bend, the sensor section without damaging components, such as signal lines, and to delimit the logic means section from the sensor means section by means of a recess. The recess is embodied and arranged such that the deformation force is not transferred to the logic means section in response to a deformation of the printed circuit board outside of the logic means section, the logic means section is thus not deformed (as well) but is only deflected relative to the sensor section.

In contrast, the further printed circuit board outside of the flat logic means section, thus in the sensor section, is embodied so as not to be flat at least in sections and extends out of the plane of the logic means section, in particular by arching or bending, respectively, the printed circuit board.

In the case of a coffee machine comprising an uneven front panel, a printed circuit board, which is embodied in this manner, makes it possible to embody and arrange touch sensors and logic means in a particularly simple and advantageous manner such that a simple mounting and a design, which is less susceptible to errors, results.

Advantageous further developments of the invention are specified in the subclaims. All combinations of at least two features, which are disclosed in the description, the claims and/or the figures, fall within the context of the invention.

If the logic means section is arranged in the area of two edge sides of the printed circuit boards, which run at an angle to one another, it is possible to form a logic means section tab, in that provision is made for a recess in the printed circuit board, starting at an edge side parallel to the edge side, which runs at an angle thereto, so that a tab on the edge side is created. If the logic means section is located in an area, which is spaced apart farther from an edge of the printed circuit board, a logic means tab can be formed, for example, in that provision is made in the printed circuit board for three line-like, straight or also curved recesses, which run at an angle to one another, and which are preferably arranged so as to form the sides of a U relative to one another.

In response to a corresponding arrangement of the logic means section substantially in the vicinity of only an outer edge of the printed circuit board it is also possible to form a logic means section tab by means of two recesses, which run at an angle to one another and which are preferably arranged like the sides of an L. It goes without saying that, as already suggested, recesses do not need to be arranged at an angle to one another, but a curved course of a recess can also be chosen. It is only important to release the logic means section such that even though it is still integrally connected to the sensor section, the sensor means section, which preferably has a larger surface, can be adjusted relative to the logic means section by means of deformation, without thereby influencing the straight molding of the logic means section.

Particularly advantageously, the logic means, preferably all of the surface-mounted components, are arranged on a different side of the printed circuit board than the touch sensors, wherein the touch sensors are preferably arranged on a side facing the front panel (thus on the user side) of the printed circuit board. On the one hand, this facilitates a fit on the outer side, because the latter does not have any protruding components. On the other hand, capacitive interferences to the outer side, which could negatively influence the touch sensors, are avoided through this.

Preferably, the logic means section is de-energized, it thus does not have any inherent force, which wants to change the shape thereof, in particular no reset force against an elastic deformation.

It is in particular prevented through this that the logic means and/or further components, which are attached in the logic means section, detach from the printed circuit board due to a surface tension.

Particularly preferably, the logic means section is connected to the further printed circuit board, in particular the sensor section, only via a straight line, that is, the integral transition between the logic means section and the sensor section is embodied by means of a straight line, in top view onto the printed circuit board, or the transition is embodied as preferably rectangular surface in a cross section, respectively.

Preferably, the transition between logic means section and the further printed circuit board, in particular the sensor section, is of a flexible or resilient type, respectively, so that the logic means section can be deflected relative to the sensor section.

The sensor section can be deformed plastically and/or elastically, in particular for adapting to the shape of the front panel of the coffee machine, to attain a shape, which emerges from the plane of the logic means. This has the advantage that a standard flat printed circuit, which can be obtained easily and which can be produced easily by means of mass production, can be used for the common printed circuit board, which is brought into its three-dimensionally deformed shape by means of corresponding forming.

Preferably, surface-mounted components are not attached on the side of the printed circuit board, which faces the user or the front panel, respectively, and on which the capacitively effective touch detection surfaces of the touch sensors are attached, thus on the user or outer side, respectively, in particular in the sensor section.

This makes it possible to attach the printed circuit board to the front panel, in particular without any gaps, which prevents in particular air pockets between the capacitively effective surfaces and the front panel, whereby the detection accuracy is increased with regard to a touching of the touch sensors by the user.

The mechanical cohesion of the printed circuit board with the front panel can be attained by means of adhesives, which are applied between them, wherein the use of such adhesives can further counteract air pockets.

In the alternative or additionally, the printed circuit board can be fixed by means of a mechanical clamping connection, snap and/snap-lock connection, for example a clip connection, between the front panel and a further element, which is arranged downstream form the printed circuit board, wherein the printed circuit board is secured in its position, preferably at least in sections by means of a bilateral contact pressure.

Glass fiber mats, in particular FR4, which are saturated in particular in epoxy resin, can be used as material for printed circuit boards. These are tested as common printed circuit board material and are characterized by their low material costs and material characteristics, in particular flexibility and electromagnetic characteristics for the application at hand.

In particular a value of between 0.1 mm and 0.4 mm, in particular 0.3 mm, has turned out to be advantageous as thickness for the printed circuit board. These values offer a good compromise between flexibility, space requirement and stability.

The (surface) extension of the logic means section on one side is preferably at least 2 $cm^2$, more preferably at least 4 $cm^2$, particularly preferably at least 6 $cm^2$. Sufficient space for logic means in the form of microcontrollers as well as for further surface-mounted components is provided through this.

In addition to the common printed circuit board according to the invention for logic means and the touch sensors, provision can additionally be made for a further printed circuit board in the interior of the coffee machine, thus farther away from the user side than the common printed circuit board. Provision can in particular be made on said additional printed circuit board for illuminating means for illuminating the operating unit and/or further functional elements, such as, for example, an LCD display. The common printed circuit board preferably has recesses, which are assigned to the illuminating means and which allow the light thereof to pass. The distance of the illuminating means to the common printed circuit board makes it possible to illuminate the front panel diffusely, which would not be possible in this manner in the case of an arrangement on the front printed circuit board. To conduct the light from the illuminating means to the front panel, light-conducting means can be used, which guide the light to the desired locations of the front panel, in particular by means of lighting channels. The light-conducting means preferably comprise a solid body having hollow (light-conducting) channels, which more preferably have an extension (in the direction from front panel into the interior of the housing) of at least 2 cm.

Due to the uneven surface, an arrangement of the illuminating means on the front printed circuit board would be made more difficult and would be associated with assembly problems. The illuminating means would need to be arranged on a front side of the front printed circuit board here, which would also counteract a flat adjoining of the printed circuit board on the front panel (with the above-mentioned disadvantages). The illuminating means could be realized on the rear side of the front printed circuit board only by means of involved designs, such as a curved optical fiber to a recess of the printed circuit board, which would result in a punctiform illumination and not in a desired diffuse illumination here.

It is particularly advantageous, if the signal-conducting means run or are arranged, respectively, on the rear side of the conductor path for the most part, thus at at least 90%, preferably completely. By means of an arrangement on the front side, the signal-conducting means would react capacitively to external influences and would thus possibly negatively influence the touch detection, for example in that a touching of the signal-conducting means would trigger a touch detection signal.

A light-permeable imprint can be applied to the front panel, in particular by means of screen printing or the like.

The invention also leads to a mounting method for mounting a coffee machine, in particular a fully automatic coffee machine, preferably a coffee machine, which is embodied as described above. The core of the method is to provide an operating unit, which is preferably still flat initially, or an operating unit, which initially still has a flat printed circuit board, respectively, wherein the printed circuit board has a logic means section, assembled with logic means, as well as a sensor section having at least one touch sensor. The touch sensor is embodied for generating an operating signal when touched by an operator, wherein the touch sensor is connected to the logic means via signal-conducting means on the printed circuit board in a signal-conducting manner, wherein the operating signal can be transferred to the logic means via the signal-conducting means. In the finally mounted state of the coffee machine, the logic means are connected to coffee producing means in a signal-conducting manner, they can thus be connected to the coffee producing means prior to the finished mounting. The logic means section and the sensor section transition integrally into one another, the special feature is that that the logic means section is delimited from the sensor section by means of at least one, preferably flap-like recess of the printed circuit board such that the logic means section is not deformed in response to the deformation of the sensor section. According to a further method step, the sensor section is now deformed, in particular bent, that is arched, wherein the logic means section is not substantially negatively influenced by this due to the specific embodiment of the printed circuit board, but remains in a straight plane, while the sensor section transitions into the logic means section, which remains straight due to the recess, in a deformed, in particular arched manner. Signal lines are thus preserved at least for the most part and the formation of hairline cracks is avoided, which benefits the service life of the operating unit.

BRIEF DESCRIPTION OF THE DRAWINGS

Further advantages, features and details of the invention follow from the subsequent description of preferred exemplary embodiments as well as by means of the drawings.

DETAILED DESCRIPTION

Figure 1A:
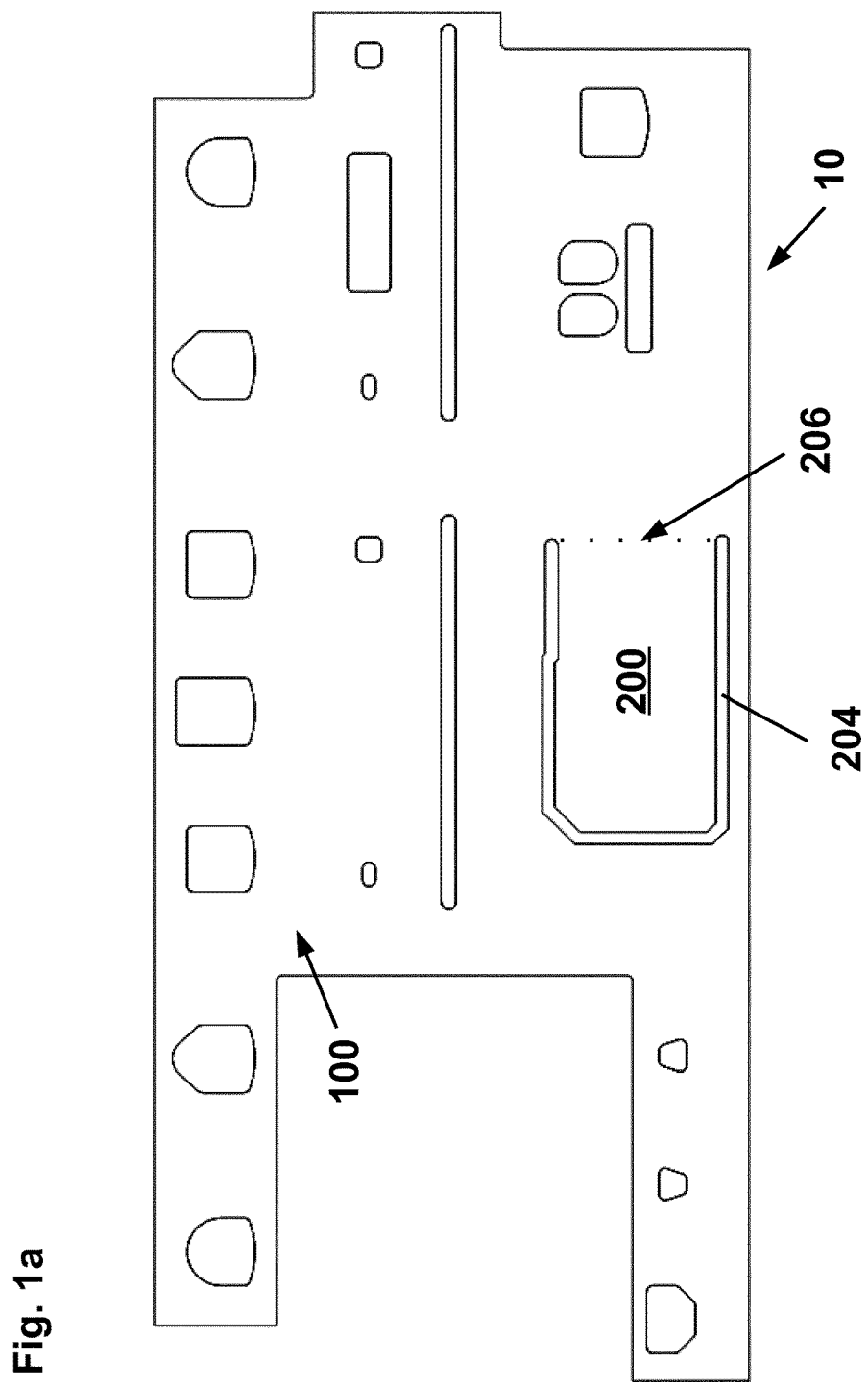
FIG. 1a shows the rear side of an exemplary embodiment of a common printed circuit board for inserting into a coffee machine according to the invention in a schematic top view.
Figure 1B:
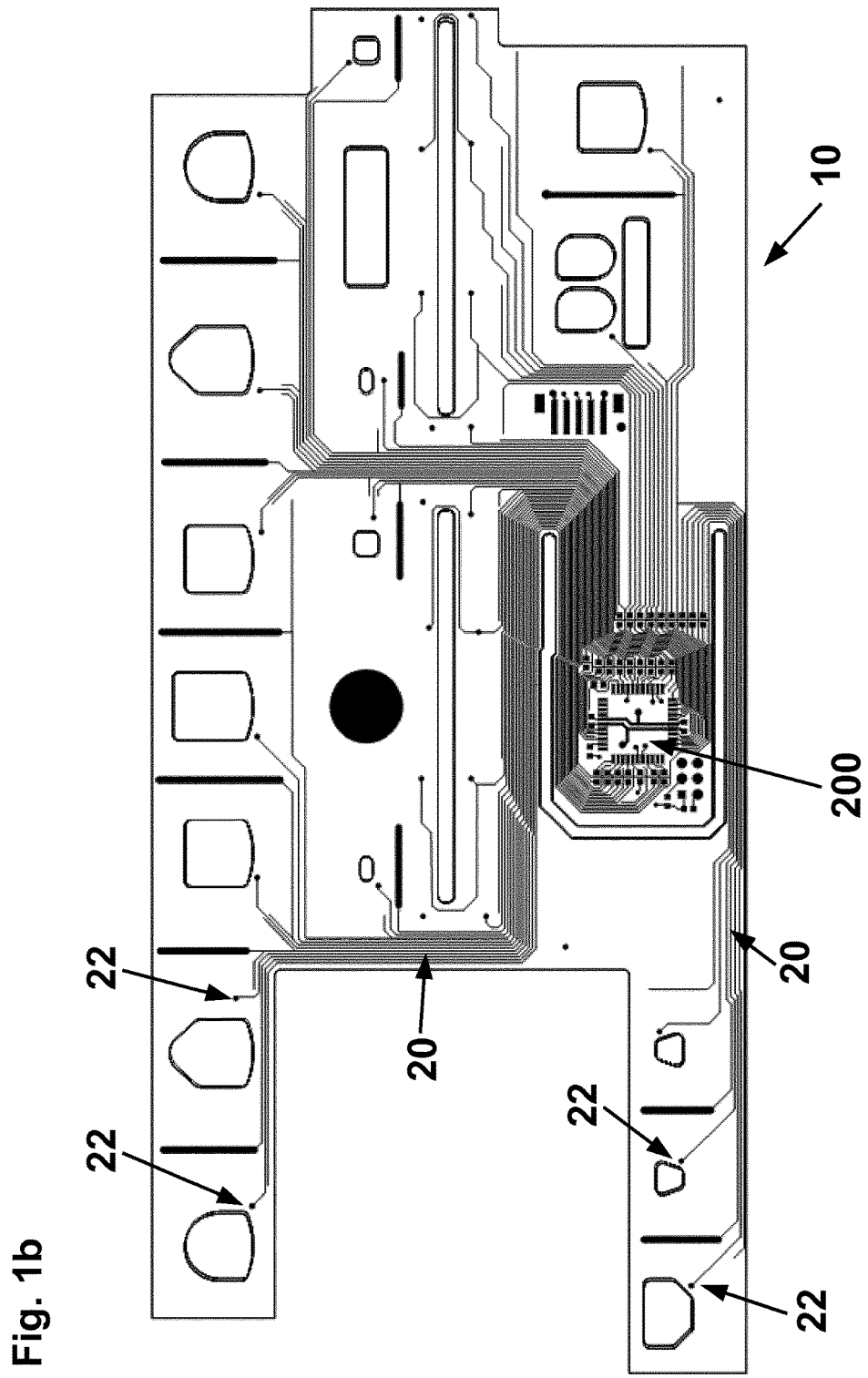
FIG. 1b shows a schematic top view of the printed circuit board from FIG. 1a with the conducting layers, which are assigned to the rear side.
Figure 1C:
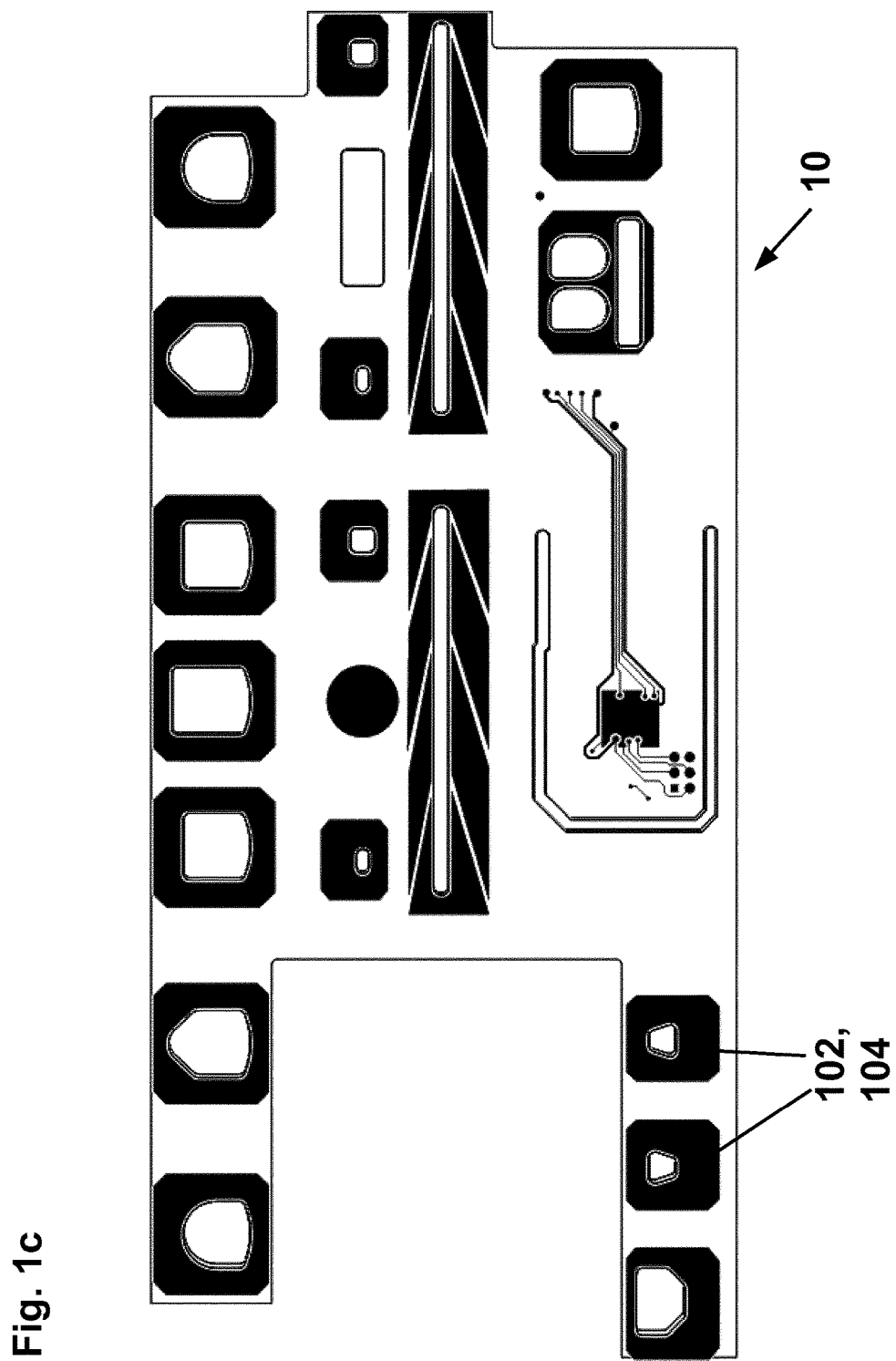
FIG. 1c shows a schematic view of the printed circuit board from FIG. 1a with the conducting layers, which are assigned to the front side.

The printed circuit board 10 shown in FIGS. 1a to 1c comprises a sensor section 100 as well as a logic means section 200. Touch sensors 102 comprising capacitively effective surfaces 104 are provided in the sensor section 100 (as illustrated in particular in FIG. 1c). Logic means 202 are provided in the logic means section 200. The capacitively effective surfaces 104 are connected to the logic means 202 via signal-conducting means 20, which are arranged on the rear side (as they are illustrated in FIG. 1b). The front-side capacitively effective surfaces 104 are electrically connected to the rear-side signal-conducting means 20 by means of electrically conductive feedthroughs 22.

The logic means section 200 is delimited from the sensor section 100 by means of a tab-like recess 204. This recess 204 is embodied and arranged such that the logic means section 200 is not deformed as well in response to a deformation of the sensor section 100 into a shape, which protrudes outside of the plane of the sensor section 100, but instead remains as flat surface. The logic means section 200 likewise remains deenergized after the deformation of the sensor section 100.

The logic means section 200 integrally transitions into the sensor section 100, wherein the transition takes place along an integrally continuous straight line 206 in the top view.

The printed circuit board 10 is made from FR4 comprising a thickness of 0.3 mm. This results in a good stability, wherein the printed circuit board 10 is sufficiently flexible to ensure a simple deformation of the sensor section 100 and also provides for a resilient support of the logic means section 200 against the sensor section 100.

Figure 2:
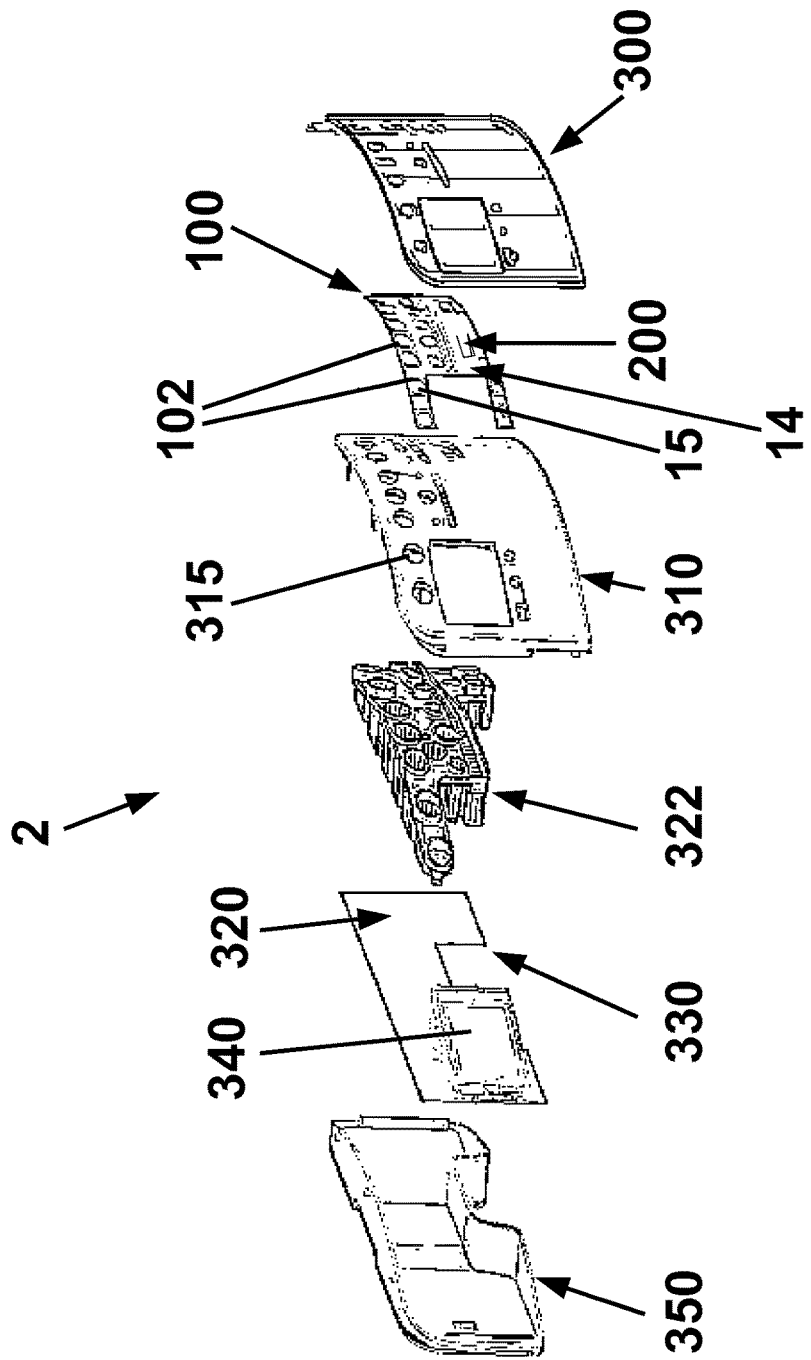
FIG. 2 shows the printed circuit board from FIG. 1 in an operating unit comprising a front panel, illuminating means and a further printed circuit board.

FIG. 2 shows the use of the printed circuit board 10 shown in FIG. 1 in an operating unit of a coffee machine in an exploded illustration.

The front side 14 of the printed circuit board 10 is hereby matched so as to accurately fit the contour of a front panel 300. The front side 14 is embodied so as to be substantially smooth herein, in particular no surface-mounted components are attached thereto. Compared to the front panel 300, the printed circuit board 10 is connected without any gaps by means of an adhesive, whereby undesired air pockets, which would negatively influence the detection signal of the touch sensors 102, are avoided through this.

On the rear side, the printed circuit board 10 rests against a first support element 310 in the form of a molded plastic part.

As an alternative or in addition to the above-described adhesive connection between printed circuit board 10 and the front panel 300, the printed circuit board 10 could also be fixed mechanically to the front panel 300, for example in that a clamping connection, snap and/snap-lock connection, in particular a clip connection, which fixes the printed circuit board in its position by means of bilateral contact pressure, is provided between the front panel 300 and the first support element 310.

A further printed circuit board 330, on which illuminating means 320 are arranged in the form of LEDs, which serve to illuminate the front panel 300, is arranged downstream from the support element 310, farther on the inside of the coffee machine.

The light from the illuminating means 320 is transferred to the front parts of the coffee machine via light-conducting means 322, which comprises lighting channels. The light-conducting means 322 are preferably fixedly connected to the support element 310, in particular screwed together and, together with it, form a supporting element.

The printed circuit board 10 as well as the first support element 310 furthermore have recesses 15 or 315, respectively, which are embodied and arranged for allowing light to pass, which was created by means of the illuminating means 320 on the rear side of said recesses, and which was transferred by means of the light-conducting means 322.

A display 340, which can be operated through corresponding recesses in the light-conducting means 322, the support element 310 and the printed circuit board 10 via the front panel 300, is furthermore attached to the further printed circuit board 330. The display can be shifted relative to the further printed circuit board 330 so as to compensate for a possible offset.

A second support element 350, which can cooperate with the first support element 310 in an accurately fitting manner such that the light-conducting means 322 as well as the further printed circuit board 330 are surrounded by it, is arranged downstream from the further printed circuit board 330.

Figure 3:
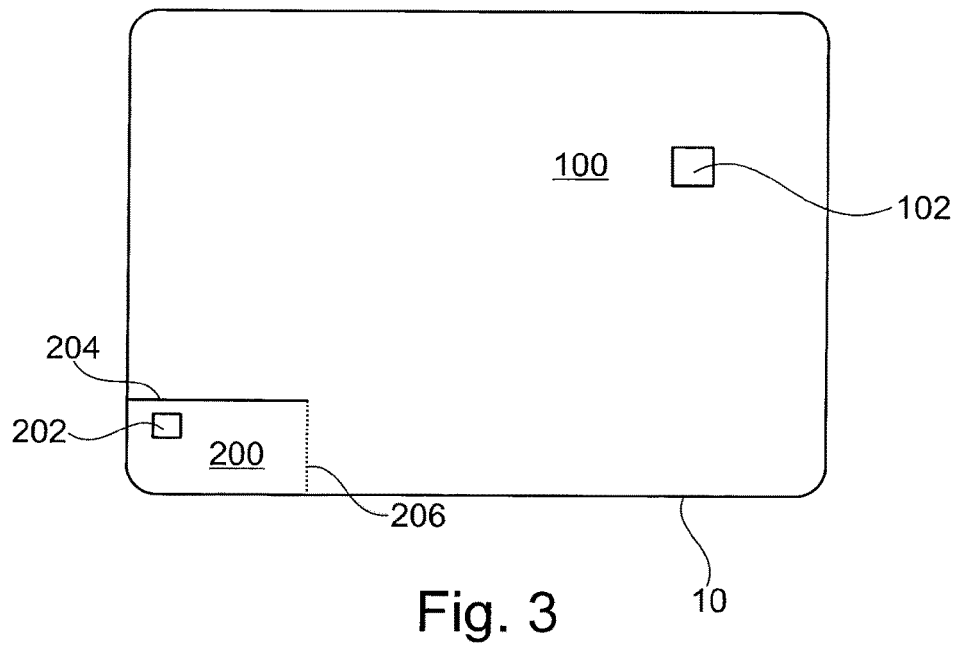
FIG. 3 shows an alternative operating unit comprising an arrangement of the logic means section on the edge side.
Figure 4:
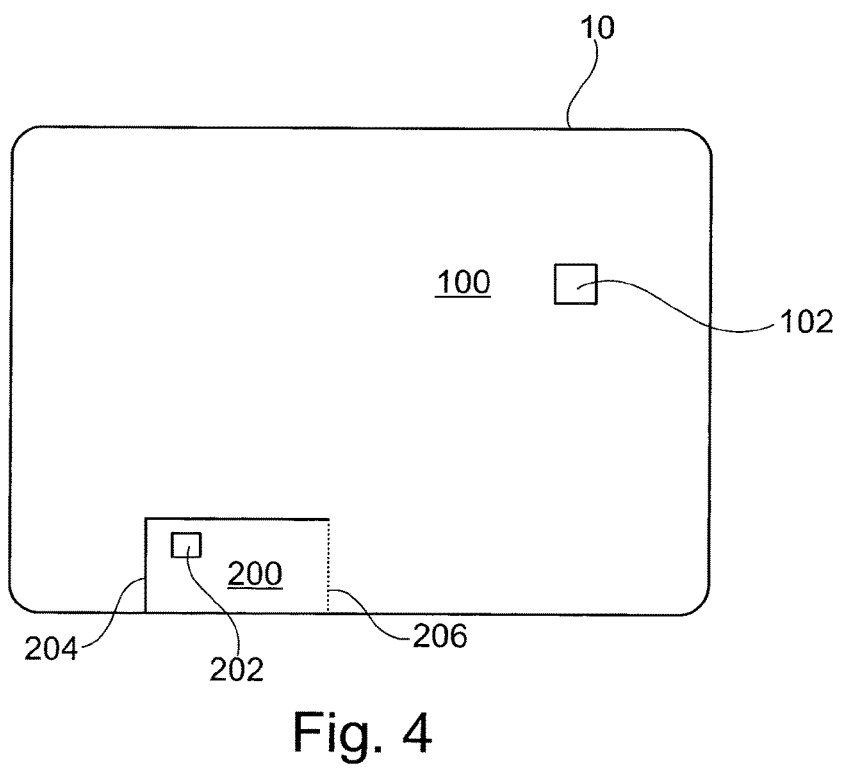
FIG. 4 shows a further alternative arrangement of the logic means section.

FIGS. 3 and 4 show alternative printed circuit board configurations in a highly schematic and in an only exemplary manner. In both cases, a logic means section tab results, but by means of a number of recesses, which are arranged at an angle to one another or by means of recesses, which have different lengths or sizes, respectively.

In the case of the exemplary embodiment according to FIG. 3, the logic means section 200 is located adjacent to two edge sides, which run at an angle to one another, is thus arranged on the corner side, so that it is sufficient to create a flap-like logic means section, which transitions into the sensor section 100 in the area of an integrally continuous straight line 206, by providing a recess 204, which is straight herein, in an exemplary manner.

Due to the arrangement of the logic means section 200 adjacent to a sole edge side of the printed circuit board 10 so as not to be on the corner side, but on the edge side, the tab shape of the logic means section can be attained by means of two recesses 204, which are arranged at an angle to one another, or, in the alternative, via a recess, which is curved in the shape of half a U—what is significant is the deflectability of the sensor section 100 about the continuous straight line 206 relative to the logic means section 200, which, in response to a deformation of the sensor section 100, extends in a straight line out of the resulting curvature of the sensor section, whereby non-illustrated signal-conducting means, which intersect the continuous straight line 206, are not curved in the area of the logic means section and are curved only slightly in the transition area to the sensor section 100.

The invention claimed is:

1. A coffee machine (1), in particular a fully automatic coffee machine, comprising an operating unit (2), which has at least one touch sensor (102) for generating an operating signal when touched by an operator, and signal-conducting means (20), which are embodied to conduct the operating signal to logic means (202), which are connected to coffee-producing means in a signal-conducting manner,
wherein the touch sensor (102), the signal-conducting means (20) and the logic means (202) are arranged on a common printed circuit board (10),
wherein the logic means (202) are arranged in a flat logic means section (200) of the printed circuit board (10) and the touch sensor (102) is arranged in a sensor section (100) on the printed circuit board (10),
wherein the logic means section (200) integrally transitions into the sensor section (100),
wherein the logic means section (200) is embodied as a logic means flap which is released from the sensor section (100),
wherein the sensor section (100) has a larger surface than the logic means section (200),
wherein the logic means section (200) is delimited from the sensor section (100) by means of at least one recess (204) in the printed circuit board such that the logic means section (200) is not deformed in response to a deformation of the sensor section (100),
wherein the sensor section (100) extends out of a plane of the logic means section (200) in an arched manner,
wherein the logic means section (200) integrally transitions into the sensor section (100),
wherein the signal-conducting means (20) are at least 90% arranged on a rear side (12) of the printed circuit board (10), which faces away from the touch sensor (102), further comprising illuminating means (320) for illuminating a front panel (300) the operating unit (2) from a rear side of the front panel (300), said illuminating means (320) being arranged on a further printed circuit board (330) positioned further toward an interior of the coffee machine than the common printed circuit board (10), and
further comprising a support element (310) arranged between the printed circuit board (10) and the illuminating means (320) and having recesses (315) for allowing light from the illuminated means (320) to reach the front panel (300).

2. The coffee machine according to claim 1, wherein the logic means (202) are arranged on a rear side (12) of the printed circuit board (10), which faces away from the touch sensor (102), which is arranged on a user side.

3. The coffee machine according to claim 1, wherein the logic means section (200) is deenergized.

4. The coffee machine according to claim 1, wherein in a top view onto the printed circuit board (10), the logic means section (200) is only connected to the printed circuit board (10) along an integrally continuous straight line (206).

5. The coffee machine according to claim 1, wherein the sensor section (100) is elastically and/or plastically deformed out of the plane of the logic means section (200).

6. The coffee machine according to claim 1, wherein the printed circuit board (10) has a thickness of between 0.1 mm and 0.4 mm.

7. The coffee machine according to claim 1, wherein the printed circuit board (10) comprises glass fiber mats which are saturated in epoxy resin.

8. The coffee machine according to claim 1, wherein the sensor section (100) is embodied so as to rest flat against a front panel (300), wherein an adhesive layer is arranged between the sensor section (100) and the front panel (300), said further adhesive layer provides for an air pocket-free transition between the front panel (300) and the sensor section (100), in particular in a section, which is assigned to capacitively effective surfaces (104) of the touch sensors (102).

9. The coffee machine according to claim 1, wherein the printed circuit board (10) is fixed between a front panel (300) and a support element (310).

10. The coffee machine according to claim 1, wherein the logic means section (200) is fixed to a support.

11. The coffee machine according to claim 1, wherein the touch sensor (102) is a capacitive touch sensor.

12. The coffee machine according to claim 1, wherein the printed circuit board (10) has a thickness of 0.3 mm.

13. The coffee machine according to claim 1, wherein the signal-conducting means (20) are completely arranged on a rear side (12) of the printed circuit board (10).

14. A method for operating a coffee machine, comprising the steps:
providing a coffee machine (1) comprising an operating unit (2), which has at least one touch sensor (102) for generating an operating signal when touched by an operator, and signal-conducting means (20), which are embodied to conduct the operating signal to logic means (202), which are connected to coffee-producing means in a signal-conducting manner, wherein the touch sensor (102), the signal-conducting means (20) and the logic means (202) are arranged on a common printed circuit board (10), wherein the logic means (202) are arranged in a flat logic means section (200) of the printed circuit board (10) and the touch sensor (102) is arranged in a sensor section (100) on the printed circuit board (10), wherein the logic means section (200) integrally transitions into the sensor section (100), wherein the logic means section (200) is embodied as a logic means flap which is released from the sensor section (100), wherein the sensor section (100) has a larger surface than the logic means section (200), wherein the logic means section (200) is delimited from the sensor section (100) by means of at least one recess (204) in the printed circuit board such that the logic means section (200) is not deformed in response to a deformation of the sensor section (100), wherein the sensor section (100) extends out of a plane of the logic means section (200) in an arched manner, wherein the logic means section (200) integrally transitions into the sensor section (100), wherein the signal-conducting means (20) are at least 90% arranged on a rear side (12) of the printed circuit board (10), which faces away from the touch sensor (102), further comprising illuminating means (320) for illuminating a front panel (300) the operating unit (2) from a rear side of the front panel (300), said illuminating means (320) being arranged on a further printed circuit board (330) positioned further toward an interior of the coffee machine than the common printed circuit board (10), and further comprising a support element (310) arranged between the printed circuit board (10) and the illuminating means (320) and having recesses (315) for allowing light from the illuminated means (320) to reach the front panel (300); and deforming the sensor section (100) out of a plane of the logic means section (200), wherein the logic means section (204) is not deformed thereby, but remains in a plane, out of which the sensor section (100) extends after the deforming step, in a curved manner.

* * * * *